(12) United States Patent
Schemmann

(10) Patent No.: US 10,164,407 B2
(45) Date of Patent: *Dec. 25, 2018

(54) SEMICONDUCTOR LASER WITH INTEGRATED PHOTOTRANSISTOR

(71) Applicant: KONINKLIJKE PHILIPS N.V., Eindhoven (NL)

(72) Inventor: Marcel Franz Christian Schemmann, Maria Hoop (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/665,471

(22) Filed: Aug. 1, 2017

(65) Prior Publication Data

US 2017/0331252 A1   Nov. 16, 2017

Related U.S. Application Data

(63) Continuation of application No. 15/000,494, filed on Jan. 19, 2016, now Pat. No. 9,735,546, which is a
(Continued)

(30) Foreign Application Priority Data

Dec. 11, 2007   (EP) ..................... 07122813

(51) Int. Cl.
*H01S 5/187*   (2006.01)
*G06F 3/03*   (2006.01)
(Continued)

(52) U.S. Cl.
CPC ............ *H01S 5/187* (2013.01); *G06F 3/0317* (2013.01); *H01L 31/1105* (2013.01);
(Continued)

(58) Field of Classification Search
CPC .......... H01S 5/18–5/187; H01S 5/0262; H01S 5/0264; H01L 31/1105; H01L 31/167;
(Continued)

(56) References Cited

U.S. PATENT DOCUMENTS 5,216,686 A   6/1993  Holm
5,266,794 A   11/1993 Olbright et al.
(Continued)

FOREIGN PATENT DOCUMENTS

JP   61079268 A   9/1986
JP   05267790 A   10/1993
(Continued)

OTHER PUBLICATIONS

Lott et al, "Deep Red Vertical Cavity Surface Emitting Lasers With Monolithically Integrated Phototrasnstors for Output Power Control" Oct. 1996, 15th IEEE International Semiconductor Laser Conference, 185-186.

*Primary Examiner* — Joshua King

(57) ABSTRACT

The present invention relates to a semiconductor laser for use in an optical module for measuring distances and/or movements, using the self-mixing effect. The semiconductor laser comprises a layer structure including an active region (3) embedded between two layer sequences (1, 2) and further comprises a photodetector arranged to measure an intensity of an optical field resonating in said laser. The photodetector is a phototransistor composed of an emitter layer (e), a collector layer (c) and a base layer (b), each of which being a bulk layer and forming part of one of said layer sequences (1, 2). With the proposed semiconductor laser an optical module based on this laser can be manufactured more easily, at lower costs and in a smaller size than known modules.

20 Claims, 2 Drawing Sheets

Related U.S. Application Data continuation of application No. 12/746,770, filed as application No. PCT/IB2008/055159 on Dec. 9, 2008, now abandoned.

(51) Int. Cl.
*H01S 5/026* (2006.01)
*H01L 31/11* (2006.01)
*H01L 31/167* (2006.01)
*H01L 31/18* (2006.01)
*H01S 5/183* (2006.01)
*H01S 5/022* (2006.01)

(52) U.S. Cl.
CPC .......... *H01L 31/167* (2013.01); *H01L 31/184* (2013.01); *H01S 5/0264* (2013.01); *H01S 5/183* (2013.01); *H01S 5/02296* (2013.01); *H01S 5/18388* (2013.01)

(58) Field of Classification Search
CPC .. H01L 31/173; H01L 31/184–31/1848; H01L 33/105; H01L 33/465; H01L 31/125; H01L 31/145
See application file for complete search history.

(56) References Cited

U.S. PATENT DOCUMENTS

| | | |
|---|---|---|
| 5,331,658 A | 7/1994 | Shieh et al. |
| 5,577,064 A | 11/1996 | Swirhun et al. |
| 5,828,088 A | 10/1998 | Mauk |
| 5,892,786 A | 4/1999 | Lott |
| 6,236,671 B1 | 5/2001 | Babic |
| 6,586,721 B2 | 7/2003 | Estevez-Garcia |
| 6,707,027 B2 | 3/2004 | Liess et al. |
| 7,161,227 B2 | 1/2007 | Lempkowski et al. |
| 9,735,546 B2 * | 8/2017 | Schemmann ........... H01S 5/187 |
| 2003/0021322 A1 | 1/2003 | Steinle et al. |
| 2004/0021158 A1 | 2/2004 | Mikawa |
| 2005/0041714 A1 | 2/2005 | Kim |
| 2005/0286585 A1 | 12/2005 | Guenther et al. |
| 2005/0286595 A1 | 12/2005 | Guenter |
| 2006/0004606 A1 | 1/2006 | Wendl et al. |
| 2006/0011938 A1 | 1/2006 | Debray |
| 2006/0072102 A1 | 4/2006 | Jianping et al. |
| 2007/0091295 A1 | 4/2007 | Xu et al. |
| 2011/0064110 A1 | 3/2011 | Gerlach et al. |

FOREIGN PATENT DOCUMENTS

| | | |
|---|---|---|
| JP | 09042916 A | 2/1997 |
| WO | 9314520 A1 | 7/1993 |
| WO | 2004021158 A2 | 3/2004 |
| WO | 2006026628 A2 | 3/2006 |
| WO | 2006042072 A2 | 4/2006 |
| WO | 2006074011 A2 | 7/2006 |
| WO | 2007072446 A2 | 6/2007 |

* cited by examiner

SEMICONDUCTOR LASER WITH INTEGRATED PHOTOTRANSISTOR

This application is a continuation of U.S. patent application Ser. No. 15/000,494 filed Jan. 19, 2016 which is a continuation of U.S. patent application Ser. No. 12/746,770, filed Jun. 8, 2010, 2011, which is the National Stage of International Application No. PCT/IB2008/055159, filed Dec. 9, 2008, which claims the priority of foreign application EP07122813.4 filed Dec. 11, 2007, all of which are incorporated herein in whole by reference.

FIELD OF THE INVENTION

The present invention relates to a semiconductor laser, in particular a vertical cavity surface emitting laser (VCSEL), comprising a layer structure including an active region embedded between two layer sequences and comprising a photodetector arranged to measure the intensity of an optical field resonating in said laser. The invention further relates to an optical sensor module for measuring distances and/or movements and including such a semiconductor laser.

BACKGROUND OF THE INVENTION

An important application of the proposed semiconductor laser is the use in an optical sensor module measuring distances and/or movements. Such an optical sensor module comprises at least one optical sensor including a laser having a laser cavity for generating a measuring beam, converging means for converging the measuring beam in an action plane and for converging measuring beam radiation that is reflected by an object into the laser cavity to generate a self-mixing effect and means for measuring the self-mixing effect, which means comprise a radiation-sensitive detector and associated signal-processing circuitry. Such an optical sensor module may be included in an optical input device that is based on the movement of an object and the device with respect to each other, but may also form part of measuring apparatuses of different types.

U.S. Pat. No. 6,707,027 discloses such an optical input device that uses the self-mixing effect. Laser self-mixing occurs if an external reflector, or object, is arranged in front of a laser so that an external laser cavity is obtained. In the case of an input device, movement of the device and the object, i.e. the reflector, which may be a human finger or a desk surface, with respect to each other causes tuning of the external cavity. Such tuning results in re-adjustment of the laser equilibrium conditions and thus in detectable changes in the laser output power. These changes, or undulations, are repetitive as a function of the displacement of the object over a distance equal to half the wavelength of the laser radiation along the axis of the light beam. This means that the laser undulation frequency becomes proportional to the speed of the external reflector.

A measuring device based on laser self-mixing shows high sensitivity, and thus accuracy, which can be attributed to the fact that reflected laser radiation re-entering the laser cavity determines the laser frequency and thus is amplified in the laser cavity. In this way, high receiver sensitivity is obtained without the use of additional means, like optical filters, or complex devices such as interferometers. An optical input device of this type equipped with two diode lasers allows measurement of movements of the device and the object with respect to each other in two mutually perpendicular (x- and y-) directions and any intermediate direction. Such a device can be used to navigate or move a cursor across a display panel, for example, to select an icon on the display.

U.S. Pat. No. 5,892,786 discloses an output control of a vertical microcavity light emitting device. This device includes a VCSEL-type diode laser embedded between two DBR stacks, wherein a phototransistor is embedded in one of the DBR stacks. With the output of the phototransistor, which measures the intensity of the optical field inside of the laser cavity, the output power can be controlled to achieve a constant level. The device of this document neither uses the self-mixing effect nor is it designed to convert measuring radiation from an object into a measuring signal. The heterojunction phototransistor of this module comprises a layer which includes a quantum well. This quantum well increases the wavelength selectivity of the phototransistor to detect only radiation having the desired laser wavelength of stimulated emission and not the broad wavelength range of spontaneous emission. Due to this quantum well, the gain of the phototransistor is large. Such a device, however, is not suitable for applications such as measuring distances and/or movements with high accuracy using the self-mixing effect.

SUMMARY OF THE INVENTION

It is an object of the present invention to provide a semiconductor laser and an optical module for measuring distances and/or movements, using the self-mixing effect, in which optical module the semiconductor laser can be used and, in addition, manufactured more easily, at lower cost and in a smaller size than in known modules.

The proposed semiconductor laser comprises a layer structure including an active region embedded between two layer sequences and further comprises a photodetector arranged to measure the intensity of an optical field resonating in said laser. The photodetector is a phototransistor composed of an emitter layer, a collector layer and a base layer, each of which being a bulk layer and forming part of one of said layer sequences, in the following also referred to as layer stacks.

The semiconductor laser is preferably a vertical cavity surface emitting laser (VCSEL), with the two layer stacks forming the two end mirrors of the laser cavity. These end mirrors may be, for example, distributed Bragg reflectors (DBR). Alternatively, the semiconductor laser may also be designed to form an edge-emitting laser, with the two layer sequences forming the cladding layers for guiding the laser radiation within the active region.

In the proposed semiconductor laser a phototransistor having an emitter layer, a collector layer and a base layer, all of which are bulk layers, is embedded in one of the layer stacks or layer sequences. Bulk layers are understood to mean layers which do not include any additional structure, such as for example a quantum well structure. The active region is understood to mean the region or layer in which the laser radiation is generated.

The present invention is based on the insight that for an optical module used in a measuring device for measuring distances and/or movements, using the self-mixing effect, a quantum well as proposed in U.S. Pat. No. 5,892,786 should be avoided in order to achieve a high sensitivity and accuracy of the measuring device.

In the proposed semiconductor laser the photocurrent of the phototransistor should be large enough to overcome shot noise limiting the signal to noise ratio of the system. The gain of the transistor on the other hand should be low to avoid excessive phototransistor current. In other words, the base current of the phototransistor should be so high that the transistor has a low gain factor, preferably in the range between 1 and 10, to avoid excessive collector current. Therefore, the base, emitter and collector layers are preferably arranged close to the active region or layer of the semiconductor laser. In a preferred embodiment, the phototransistor is arranged in the portion of the layer stack in which the intensity of the optical field still exceeds at least 10% of the peak intensity of the VCSEL, which is achieved in the vicinity of the active region, although 3% can also be sufficient. By means of this measure, the ratio between stimulated emission and spontaneous emission is substantially increased, so that wavelength selectivity becomes a minor issue. Furthermore, the photon intensity closer to the active region is high enough to provide a sufficiently high photocurrent to overcome the shot noise limit. In an alternative embodiment, the phototransistor is placed in the half of the layer sequence which is located closer to the active region than the other half. Preferably, the phototransistor is arranged in the upper half of the n-side DBR, that is that part of the n-side DBR that is closer to the active layer.

When the proposed semiconductor laser is designed to form a VCSEL, the layers of the phototransistor are formed of layers which are already existent in one of the layer stacks forming the end mirrors of the laser cavity. These layers are doped only to have an appropriate bandgap to form the base, collector and emitter layer of the phototransistor. Preferably the collector layer is formed of a high bandgap material and the base layer and the emitter layer are formed of a low bandgap material. A low bandgap material is a material which has a bandgap which is lower than the photon energy of the optical field resonating in the laser cavity. On the other hand, the high bandgap material has a bandgap larger than the photon energy, typically significantly larger. For the complete base and emitter region, preferably the layer thickness is selected equal to one quarter optical wavelength and the layer position is such that the base resides at an optical field intensity peak and the emitter is at a null of the optical field.

Such a semiconductor laser with the proposed structure of the phototransistor can be manufactured at low cost, since only bulk layers are used. Furthermore, unlike such a semiconductor laser without a phototransistor, no additional layers have to be deposited. The invention uses layers which are already included in the layer stacks of such a laser.

By adapting the bandgap of the material of the relevant layers of the corresponding layer stack, these layers can be configured to form the phototransistor, so that no additional layers are needed, as already mentioned above, and the manufacture of the module becomes easier. Usually the layer stacks, in which the phototransistor is embedded, are layer stacks of distributed Bragg reflectors. By using a phototransistor instead of a photodiode, advantageous use can be made of the amplification of the transistor, so that an improved signal compared to a photodiode is obtained. Furthermore, no extra contact is required to the p-layer, which would form the anode of the photodiode and, in the case of a phototransistor, would form the base.

In an embodiment of the semiconductor laser, the emitter layer of the phototransistor is set to ground potential. This provides a ground contact for the laser current and a ground terminal for the phototransistor, such that both the laser anode and the phototransistor collector can be driven at a positive voltage with respect to ground, thus simplifying the powering scheme.

In a further embodiment, the semiconductor laser is designed to be a top emitting diode laser and the phototransistor is embedded in the layer sequence forming an n type reflector arranged opposite the main emitting side of the top emitting diode laser. Also in this embodiment, the collector region is preferably made in a high bandgap material and the base and emitter regions are both made in a low bandgap material, i.e. low enough to allow photon absorption to take place.

The proposed optical module comprises at least one such semiconductor laser emitting a measuring beam which, when reflected by an object, re-enters the laser cavity and generates a self-mixing effect which is measured by the phototransistor. Such an optical measuring module for measuring distances and/or movements also includes or is connected with an appropriate signal-processing circuitry which calculates the distance and/or movement, based on the measuring signal of the phototransistor. Such an optical module may be embedded in an input device or in an apparatus in which such an input device is included, since the sensor module according to the invention allows reducing the size and cost of the input device and thereby enlarges the field of applications. Including such an input device in an apparatus not only saves costs and space, but also provides the designer with more freedom of design. The input device wherein the invention is implemented may have the same construction as the laser self-mixing devices described in U.S. Pat. No. 6,707,027 (which is incorporated herein by reference), with the exception of the integrated VCSEL and phototransistor structure. Apparatuses wherein the input device can be used are for example a mouse for a desktop computer, a notebook computer, a mobile phone, a personal digital assistant (PDA) and a handheld game computer. The invention can also be used in professional measuring apparatuses for measuring, for example, distance to an object or movement of the object, movement of a liquid and movement of particles embedded in a liquid. Generally the invention may be used in any applications wherein the laser self-mixing effect can be used.

These and other aspects of the invention will be apparent from and elucidated with reference to the embodiments described herein after.

BRIEF DESCRIPTION OF THE DRAWINGS

The proposed semiconductor laser is described in the following by way of examples and with reference to the accompanying figures, without limiting the scope of protection as defined by the claims. The figures show:

DETAILED DESCRIPTION OF THE EMBODIMENTS

Figure 1:
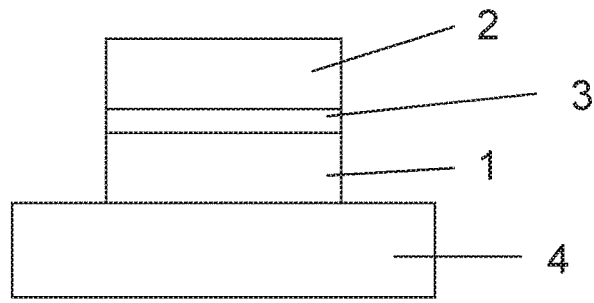
FIG. 1 a typical setup of a VCSEL laser as can be used in the present invention.

FIG. 1 shows a schematic view of the basic design of a VCSEL as it can be used in the present invention. The VCSEL comprises a lower layer stack 1 and an upper layer stack 2 with an active layer 3 embedded in between. This VCSEL is formed on a substrate 4 which may also comprise a cooling function. The lower and upper layer stacks are typically designed to form p- and n-type DBRs. The two DBRs are the end mirrors of the laser cavity, wherein the upper p-type DBR is formed so as to be partly transmissive, for example with a reflectivity of 98% for the generated laser radiation, to function as an outcoupling mirror. The upper p-type DBR and lower n-type DBRs are typically composed of alternating layers of high and low refractive index GaAs (high index) and AlAs (low index) layers. The GaAs layers have a low Al % such that the material bandgap is above the photon energy.

Figure 2:
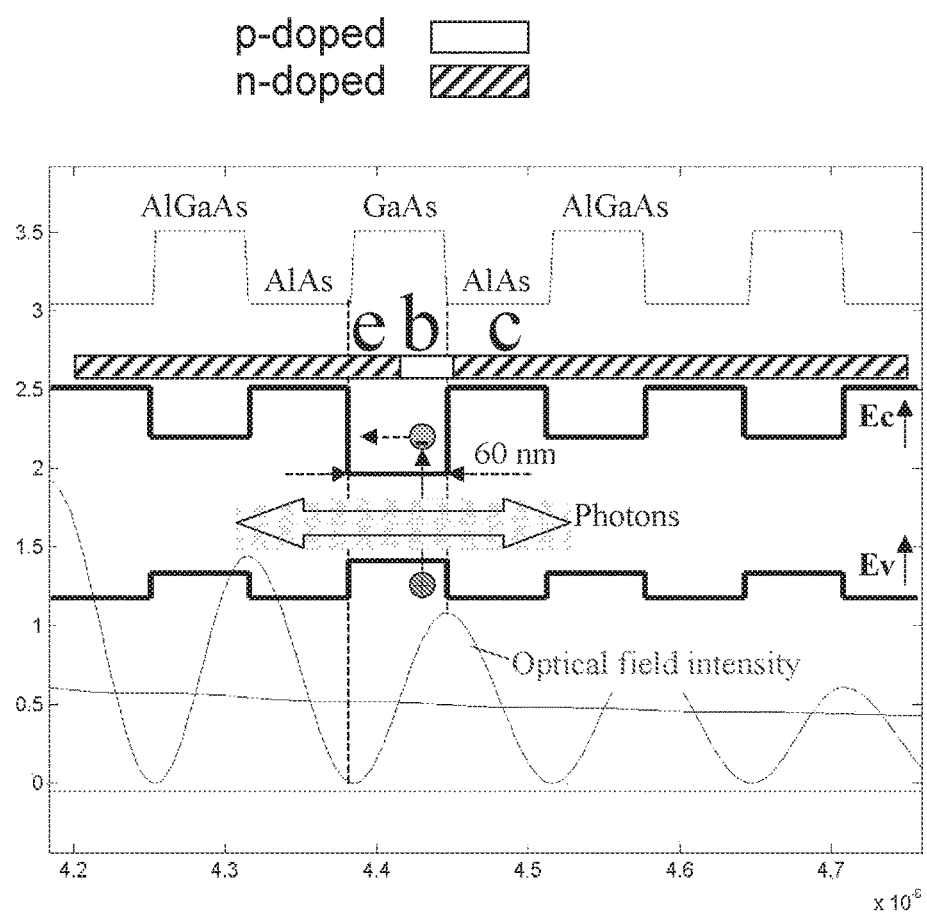
FIG. 2 a schematical view showing the location of the phototransistor relative to the optical field in the n side mirror of a VCSEL according to an example of the invention.

In the present example, the phototransistor is embedded in the lower layer stack 1, which is then side mirror (n-type DBR) of the VCSEL. FIG. 2 shows the location of the phototransistor relative to the optical field in this mirror.

A thin p-doped layer is placed at a GaAs/AlAs junction in the n-doped mirror of the VCSEL to form the base of the phototransistor. The upper line of FIG. 2 represents the material refractive index that is high in AlGaAs containing a low % of Al, quarter wavelength thick layers that are low in AlGaAs layers containing a high % of Al (or AlAs). The phototransistor layer is made of GaAs such that photons can create electron hole pairs. The electrons diffuse out of the base b, mainly into the emitter e, which is also formed in the GaAs material. The total thickness of the quarter wavelength thick GaAs layer is about 60 nm, 30 nm of which are p-doped adjacent to the AlAs n-doped collector layer c. The emitter e has the same bandgap as the base b to prevent an increase in current gain, due to the band edge step, that would occur if the emitter e had a higher bandgap than the base. FIG. 2 also schematically indicates the conduction and valance band energies (Ec and Ev respectively). These represent un-doped material properties, without application of field.

The optical intensity profile is shown in the lower portion of FIG. 2. As can be seen from this figure, the optical intensity is at a null in the emitter GaAs layer such that it does not contribute much to photon absorption, even though it has a bandgap small enough for absorption. On the other hand, the base region is at an optical field peak and has significant photon absorption. The proper placement of the base region next to an AlAs collector simplifies the requirement of a low bandgap emitter (a higher bandgap in the emitter would increase the transistor gain) without causing too high, unnecessary optical losses and allows an easy design of a low gain phototransistor.

In this embodiment, a low-gain integrated phototransistor has been designed by doping one mirror layer in a standard VCSEL differently and by a slight reduction of the Al % in that mirror layer such that it will detect photons. This forms an inefficient detector that is preferably situated in the mirror stack at a location which is close to the active layer where the laser photon density is far higher than at a location external to the laser. As a result, the intended photocurrent is comparable to that of a VCSEL with an integrated photodiode but the detection of unwanted spontaneous emission is very inefficient. The phototransistor shares the emitter n-contact with the n-contact of the laser, a p-type contact is not required. The substrate delivers the photocurrent from the collector with the same polarity as the VCSEL. With a non-alloyed n-type contact, both the VCSEL and the phototransistor could be contacted without any additional layer thickness beyond that of a standard VCSEL.

Figure 3:
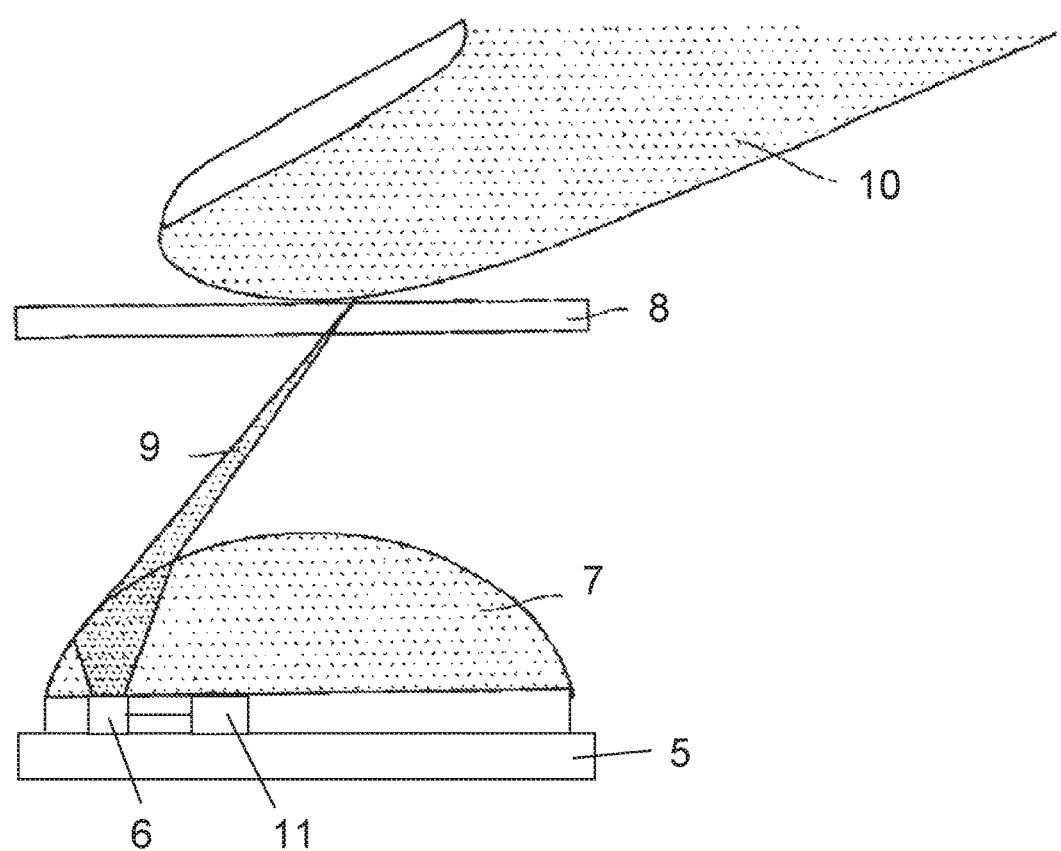
FIG. 3 a cross-section of an example of an input device.

FIG. 3 is a diagrammatic cross-sectional view of an example of an input device according to the present invention. The device comprises, at its lower side, a base plate 5, which is a carrier for the semiconductor lasers, in this embodiment the above-mentioned VCSEL-type lasers with integrated phototransistor. In FIG. 3 only one laser 6 is visible, but usually at least a second laser is provided on the base plate 5 to be able to detect movements in two perpendicular directions. The lasers emit laser beams 9. At its upper side, the device is provided with a transparent window 8 across which an object 10, for example, a human finger is to be moved. A lens 7, for example a plano-convex lens, is arranged between the diode laser 6 and the window. This lens focuses the laser beam 9 at or near the upper side of the transparent window. If an object is present at this position, it scatters the beam 9. A part of the radiation of beam 9 is scattered in the direction of the laser 6. This part is converged by the lens 7 on the emitting surface of the laser 6 and re-enters the cavity of this laser. The radiation returning into the cavity induces changes in this cavity, which results in, inter alia, a change of the intensity of the laser radiation emitted by the laser 6. This change can be detected by the phototransistor of the laser, which converts the radiation variation into an electric signal, and applies the electric signal to an electronic circuit 11 for processing this signal.

While the invention has been illustrated and described in detail in the drawings and the foregoing description, such an illustration and description are to be considered illustrative or exemplary and not restrictive, i.e. the invention is not limited to the disclosed embodiments. The different embodiments described above and in the claims can also be combined. Other variations to the disclosed embodiments can be understood and effected by those skilled in the art in practicing the claimed invention, from a study of the drawings, the disclosure and the appended claims. For example, the VCSEL used can also be composed of other material layers or may be a bottom emitting laser as known in the art. Furthermore, the semiconductor laser may also be designed as a vertical extended cavity surface emitting laser (VECSEL). The number of layers in the layer stacks is not limited by the present invention. This number can be selected appropriately for the required optical properties of the layer stack.

In the claims, the word "comprising" does not exclude other elements or steps, and the indefinite article "a" or "an" does not exclude a plurality. The mere fact that measures are recited in mutually different dependent claims does not indicate that a combination of these measures cannot be used to advantage. The reference signs in the claims should not be construed as limiting the scope of these claims.

The invention claimed is:

1. A vertical cavity surface emitter laser (VCSEL) comprising:
    a first distributed Bragg reflector (DBR),
    a second DBR, and
    an active region situated between the first and second DBRs,
    wherein each of the first and second DBRs includes multiple DBR layers,
    wherein each DBR layer comprises a material having different optical properties than a material of an adjacent DBR layer,
    wherein each DBR layer of the first DBR is a bulk layer that does not include a quantum well and has a refractive index that differs from an adjacent DBR layer, and
    wherein a single interior DBR layer of the DBR includes an n-doped layer and a p-doped layer, such that the interior DBR layer and a corresponding adjacent DBR layer form a phototransistor within the first DBR.

2. The VCSEL of claim 1, wherein the corresponding adjacent DBR layer is n-doped, thereby forming an NPN structure that forms the phototransistor within the first DBR.

3. The VCSEL of claim 1, wherein a DBR layer of the first DBR closest to the active region forms an emitter of the phototransistor.

4. The VCSEL of claim 1, wherein one of the n-doped layer and the p-doped layer forms a base of the phototransistor, and an opposite-doped one of the p-doped layer and the n-doped layer forms an emitter of the phototransistor.

5. The VCSEL of claim 4, wherein a bandgap of the base is substantially equal to the bandgap of the emitter.

6. The VCSEL of claim 4, wherein, in operation, an optical intensity of the VCSEL at the emitter is substantially lower than the optical intensity at the base.

7. The VCSEL of claim 4, wherein the corresponding adjacent DBR layer forms a collector of the phototransistor.

8. The VCSEL of claim 7, wherein a bandgap of the collector is substantially higher than a bandgap of the base of the phototransistor.

9. The VCSEL of claim 1, wherein the interior DBR layer comprises GaAs.

10. The VCSEL of claim 9, wherein the corresponding adjacent DBR layer comprises AlAs.

11. The VCSEL of claim 1, wherein a thickness of each DBR layer in the first DBR is substantially equal to a quarter wavelength of light emitted from the active region.

12. The VCSEL of claim 11, wherein a thickness of the n-doped layer and the p-doped layer in the interior DBR layer are substantially equal.

13. The VCSEL of claim 1, wherein the refractive index of the corresponding adjacent DBR layer is substantially lower than the refractive index of the interior DBR layer.

14. A vertical cavity surface emitter laser (VCSEL) comprising:
   a first distributed Bragg reflector (DBR),
   a second DBR, and
   an active region situated between the first and second DBRs,
   wherein each of the first and second DBRs includes multiple DBR layers,
   wherein each DBR layer comprises a material having different optical properties than a material of an adjacent DBR layer,
   wherein each of the DBR layers of the first DBR is a bulk layer that does not include a quantum well and has a refractive index that differs from an adjacent DBR layer,
   wherein at least one single DBR layer of the DBR layers in the first DBR is doped differently from a corresponding adjacent DBR layer in the first DBR; and
   wherein the at least one single DBR layer of the DBR layers includes an n-doped layer and a p-doped layer, so that the at least one single DBR layer of the DBR layers and the corresponding adjacent DBR layer form a phototransistor within the first DBR.

15. The VCSEL of claim 14, wherein the at least one layer of the first DBR includes less Al than the corresponding adjacent DBR layer.

16. The VCSEL of claim 14, wherein the at least one DBR layer of the first DBR comprises GaAs.

17. The VCSEL of claim 16, wherein the corresponding adjacent DBR layer comprises AlGaAs.

18. The VCSEL of claim 14, wherein the doping of the at least one DBR layer of the first DBR forms a base and an emitter of the phototransistor, the corresponding adjacent DBR layer forms a collector of the phototransistor, and a bandgap of the collector is substantially higher than a bandgap of the base and a bandgap of the emitter.

19. A method of forming a vertical cavity surface emitter laser (VCSEL) with an embedded phototransistor comprising:
   forming a first distributed Bragg reflector (DBR),
   forming a second DBR, and
   forming an active region between the first DBR and the second DBR;
   wherein forming each of the first and second DBRs includes forming multiple DBR layers,
   wherein each DBR layer comprises a material having different optical properties than a material of an adjacent DBR layer,
   wherein each DBR layer of the first DBR is a bulk layer that does not include a quantum well and has a refractive index that differs from an adjacent DBR layer,
   wherein forming the first DBR includes doping each DBR layer of the first DBR,
   wherein the doping of one single DBR layer of the DBR layers differs from the doping of an adjacent DBR layer, and
   wherein the one single DBR layer of the DBR layers comprises an n-doped layer and a p-doped layer, so that the one of the DBR layers and a corresponding adjacent DBR layer form the embedded phototransistor within the first DBR.

20. The method of claim 19, wherein a DBR layer of the first DBR closest to the active region forms an emitter of the phototransistor.

* * * * *